(12) United States Patent
Akhtar

(10) Patent No.: US 8,471,302 B2
(45) Date of Patent: Jun. 25, 2013

(54) NEUTRALIZATION CAPACITANCE IMPLEMENTATION

(75) Inventor: Siraj Akhtar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 429 days.

(21) Appl. No.: 12/911,488

(22) Filed: Oct. 25, 2010

(65) Prior Publication Data

US 2012/0098069 A1    Apr. 26, 2012

(51) Int. Cl.
  *H01L 27/06* (2006.01)
(52) U.S. Cl.
  USPC .... 257/231; 257/213; 257/368; 257/E27.014; 438/142; 438/151
(58) Field of Classification Search
  USPC ............... 257/213, 231, 232, 368, E29.12, 257/E27.014, E29.002, E29.263; 438/142, 438/151
  See application file for complete search history.

(56) References Cited

U.S. PATENT DOCUMENTS

| 7,355,479 | B2 | 4/2008 | Van Der Heijden |
| 7,829,941 | B2* | 11/2010 | Hu et al. ........................ 257/330 |
| 2005/0280096 | A1* | 12/2005 | McKay et al. ................ 257/369 |
| 2007/0046376 | A1 | 3/2007 | Van Der Heijden |

* cited by examiner

*Primary Examiner* — Daniel Whalen
*Assistant Examiner* — Suberr Chi
(74) *Attorney, Agent, or Firm* — John R. Pessetto; W. James Brady; Frederick J. Telecky, Jr.

(57) ABSTRACT

Neutralization capacitances are commonly employed to compensate for the Miller effect; however, at higher frequencies, the parasitic inductance introduced in the interconnect can affect the neutralization. Here, a layout has been provided where a MOS capacitor is merged with a complementary transistor. By having this merged device, the layout is compact and reduces interconnect area, which reduces the effects of parasitic inductance at higher frequencies (i.e., millimeter wave or terahertz). This layout can also be used to implement linearity enhancement schemes.

12 Claims, 12 Drawing Sheets

NEUTRALIZATION CAPACITANCE IMPLEMENTATION

TECHNICAL FIELD

The invention relates generally to an integrated circuit (IC) layout and, more particularly, to a layout to compensate for the Miller effect and/or to enhance linearity.

BACKGROUND

The performance of MOS transistors (i.e., NMOS transistors) can oftentimes suffer as a result of the Miller effect. Due at least in part to the geometry of the MOS transistors, a gate-drain capacitance or Cdg can exist, which can affect the reverse isolation of the MOS transistor and which can hamper gain and bandwidth. This is especially true at higher frequencies where, by default, gain is lower. A conventional technique that has been employed to compensate for the Miller effect is neutralization.

Neutralization generally employs the use of a negative or neutralization capacitance. Turning to FIG. 1, an example of a transconductance circuit 100, which employs neutralization capacitances, can be seen. As shown, transconductance circuit 100 generally comprises a pair of differential input transistor Q1 and Q2 (which, as shown, are NMOS transistors and which receive the input signals INP and INM) and capacitor-connected MOS transistors or MOS capacitors Q3 and Q4 (which, as shown, are NMOS transistors). MOS capacitors Q3 and Q4 are cross-coupled between the transistors Q1 and Q2 to provide capacitances to counter the gate-drain capacitances of transistors Q1 and Q2. A metal-metal capacitor (also referred to as a flux capacitor or MIM capacitor) can be used in the place of the MOS capacitors Q3 and Q4, but, because the gate-drain capacitances of transistors Q1 and Q2 change with bias, the MOS capacitors Q3 and Q4 more accurately track the gate-drain capacitances of transistors Q1 and Q2. Additionally, MOS capacitors Q3 and Q4 are usually a fraction (i.e. ½, ⅔, etc.) of the size of the transistors Q1 and Q2.

There are, however, problems associated with this arrangement. At higher frequencies, the parasitic inductance introduced in the interconnect can affect the neutralization, so the layout should be formulated such that the parasitic inductance at the frequency of interest is low (i.e., close to zero). Such a layout, though, can be difficult to design for millimeter wave or terahertz applications. Thus, there is a need for a layout for a transconductance circuit that compensates for the Miller effect at high frequencies.

Some other conventional circuits are: U.S. Pat. No. 7,355, 479; and U.S. Patent Pre-Grant Publ. No. 2007/0046376.

SUMMARY

A preferred embodiment of the present invention, accordingly, provides an apparatus is provided. The apparatus comprises a differential pair of compensated transistors that receive a differential input signal, wherein differential pair of compensated transistors are separated from one another by an isolation region, and wherein each compensated transistor from the differential pair includes: a first MOS transistor formed on a substrate; a back-gate region that is adjacent to the first MOS transistor; and a second MOS transistor, wherein the gate of the second MOS transistor is coupled to the gate of the first MOS transistor.

In accordance with a preferred embodiment of the present invention, the second MOS transistor is capacitor-connected, and wherein the back-gate region further comprises a first back-gate region, and wherein each compensated transistor from the differential pair further comprises a second back-gate region formed between the first and second MOS transistors, wherein the first back-gate region is coupled to the second back-gate region, and wherein each of the first and second MOS transistors further comprises: a plurality of source regions formed in the substrate; a plurality of drain regions formed in the substrate, wherein the source and drain regions are formed in an alternating pattern; and a plurality of gates formed over the substrate, wherein each gate is formed between at least one of the source regions and at least one of the drain regions, and wherein each gate includes a gate dielectric and a gate electrode.

In accordance with a preferred embodiment of the present invention, the apparatus further comprises a metallization layer, wherein at least a portion of the metallization layer couples the back-gates from each of the transistors together.

In accordance with a preferred embodiment of the present invention, an apparatus is provided. The apparatus comprises a first back-gate region; a first MOS transistor that is adjacent to the first back-gate region; a second MOS transistor, wherein the gate of the first MOS transistor is coupled to the gate of the second MOS transistor; a second back-gate region located between the first and second MOS transistors; an isolation region that is adjacent to the second MOS transistor; a third back-gate region; a third MOS transistor that is adjacent to the third back-gate region, wherein the drain of the third MOS transistor is coupled to the drain and source of the second MOS transistor; a fourth MOS transistor that is adjacent to the isolation region, wherein the gate of the fourth MOS transistor is coupled to the gate of the third transistor, and wherein the drain and source of the fourth MOS transistor are the drain of the first MOS transistor; and a fourth back-gate region formed between the third and fourth transistors, and wherein the first, second, third, and fourth back-gate regions are coupled together.

In accordance with a preferred embodiment of the present invention, each of the first, second, third, and fourth MOS transistors further comprises: a plurality of source regions formed in a substrate; a plurality of drain regions formed in the substrate, wherein the source and drain regions are formed in an alternating pattern; and a plurality of gates formed over the substrate, wherein each gate is formed between at least one of the source regions and at least one of the drain regions, and wherein each gate includes a gate dielectric and a gate electrode.

In accordance with a preferred embodiment of the present invention, the apparatus further comprises a metallization layer formed over the substrate, and wherein the metallization layer that couples the gates of the first and second transistors together, that coupled the gates of the third and fourth MOS transistors together, and that coupled the first, second, third, and fourth back-gate regions together.

In accordance with a preferred embodiment of the present invention, the metallization layer further comprises a first metallization layer, and wherein apparatus further comprises a second metallization layer that is formed over the substrate and that is coupled to the sources of the first, second, third, and fourth MOS transistors.

In accordance with a preferred embodiment of the present invention, the apparatus further comprises a third metallization layer that is formed over the substrate and that is coupled to the drains of the first, second, third, and fourth MOS transistor.

In accordance with a preferred embodiment of the present invention, the apparatus further comprises a fourth metallization layer that is formed over the substrate and that is coupled to the drain of the first MOS transistor, the drain and source of the second MOS transistor, the drain of the third MOS transistor, and the drain and source of the fourth MOS transistor.

In accordance with a preferred embodiment of the present invention, the apparatus further comprises a fifth metallization that is coupled to the fourth metallization layer so as to electrically couple the drain of the first MOS transistor to the drain and source of the fourth MOS transistor.

In accordance with a preferred embodiment of the present invention, an apparatus is provided. The apparatus comprises a substrate having first, second, third, and fourth back-gate regions; a first MOS transistor that is adjacent to the first and second back-gate regions, wherein the first MOS transistor includes: a first set of drain regions formed in the substrate; a first set of conductive vias, wherein each conductive via from the first set of conductive vias is coupled to at least one of the drain regions from the first set of drain regions; a first set of source regions formed in the substrate; a second set of conductive vias, wherein each conductive via from the second set of conductive vias is coupled to at least one of the source regions from the first set of source regions; a first set of gates formed over the substrate, wherein each gate from the first set of gates is formed between at least one of the source regions from the first set of source regions and at least one of the drain regions from the first set of drain regions; and a third set of conductive vias, wherein each conductive via from the third set of conductive vias is coupled to at least one of the gates from the first set of gates; a second MOS transistor that is adjacent to the second back-gate region, wherein the second MOS transistor includes: a second set of drain regions formed in the substrate; a fourth set of conductive vias, wherein each conductive via from the fourth set of conductive vias is coupled to at least one of the drain regions from the second set of drain regions; a second set of source regions formed in the substrate; a fifth set of conductive vias, wherein each conductive via from the fifth set of conductive vias is coupled to at least one of the source regions from the second set of source regions; a second set of gates formed over the substrate, wherein each gate from the second set of gates is formed between at least one of the source regions from the second set of source regions and at least one of the drain regions from the second set of drain regions; and a sixth set of conductive vias, wherein each conductive via from the sixth set of conductive vias is coupled to at least one of the gates from the second set of gates; an isolation region formed in the substrate that is adjacent to the second MOS transistor; a third MOS transistor that is adjacent to the third back-gate region and to the isolation region, wherein the third MOS transistor includes: a third set of drain regions formed in the substrate; a seventh set of conductive vias, wherein each conductive via from the seventh set of conductive vias is coupled to at least one of the drain regions from the third set of drain regions; a third set of source regions formed in the substrate; an eighth set of conductive vias, wherein each conductive via from the eighth set of conductive vias is coupled to at least one of the source regions from the third set of source regions; a third set of gates formed over the substrate, wherein each gate from the third set of gates is formed between at least one of the source regions from the third set of source regions and at least one of the drain regions from the third set of drain regions; and a ninth set of conductive vias, wherein each conductive via from the ninth set of conductive vias is coupled to at least one of the gates from the third set of gates; a fourth MOS transistor that is adjacent to the third and fourth back-gate regions, wherein the fourth MOS transistor includes: a fourth set of drain regions formed in the substrate; a tenth set of conductive vias, wherein each conductive via from the tenth set of conductive vias is coupled to at least one of the drain regions from the fourth set of drain regions; a fourth set of source regions formed in the substrate; an eleventh set of conductive vias, wherein each conductive via from the eleventh set of conductive vias is coupled to at least one of the source regions from the fourth set of source regions; a fourth set of gates formed over the substrate, wherein each gate from the fourth set of gates is formed between at least one of the source regions from the fourth set of source regions and at least one of the drain regions from the fourth set of drain regions; and a twelfth set of conductive vias, wherein each conductive via from the twelfth set of conductive vias is coupled to at least one of the gates from the fourth set of gates; a first metallization layer that is formed over the substrate, that couples the third and sixth sets of conductive vias together, that couples the ninth and twelfth sets of conductive vias together, and that is coupled to the first, second, third, and fourth back-gate regions; a second metallization layer that is formed over the substrate and that is coupled to the second, fifth, eighth, and eleventh sets of conductive vias; a thirteenth set of conductive vias formed over the second metallization layer; a fourteenth set of conductive vias formed over the second metallizaion layer; and a third metallization layer that is formed over the substrate and that is coupled to the first, fourth, seventh, tenth, thirteenth, and fourteenth sets of conductive vias, wherein the third metallization layer couples the drain and source of the second MOS transistor together and couples the drain and source of the third MOS transistor together.

In accordance with a preferred embodiment of the present invention, the apparatus further comprises: a fifteenth set of conductive vias formed over the third metallization layer; a sixteenth set of conductive vias formed over the third metallization layer; a seventeenth set of conductive vias formed over the third metallization layer; an eighteenth set of conductive vias formed over the third metallization layer; and a first portion of a fourth metallization layer that is coupled to the fifteenth set of conductive vias; a second portion of the fourth metallization layer that is coupled to the sixteenth and eighteenth set of conductive vias; a nineteenth set of conductive vias formed over the first portion of the fourth metallization layer; and a fifth metallization layer that is coupled to the seventeen and nineteenth sets of conductive vias.

In accordance with a preferred embodiment of the present invention, the first metallization layer further comprises a first portion that is coupled to the first, second, third, and fourth back-gate regions; a second portion that is coupled to the third and sixth set of conducive vias; and a third portion that is coupled to the ninth and twelfth sets of conductive vias.

In accordance with a preferred embodiment of the present invention, the second metallization layer further comprises: a first portion that is coupled to the second set of conductive vias; a second portion that is coupled to the fifth set of conductive vias; a third portion that is coupled to the eighth set of conductive vias; and a fourth portion that is coupled to the eleventh set of conductive vias.

In accordance with a preferred embodiment of the present invention, the third metallization layer further comprises: a first portion that is coupled to the first set of conductive vias; a second portion that is coupled to the fourth set of conductive vias; a third portion that is coupled to the seventh set of conductive vias; and a fourth portion that is coupled to the tenth set of conductive vias.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
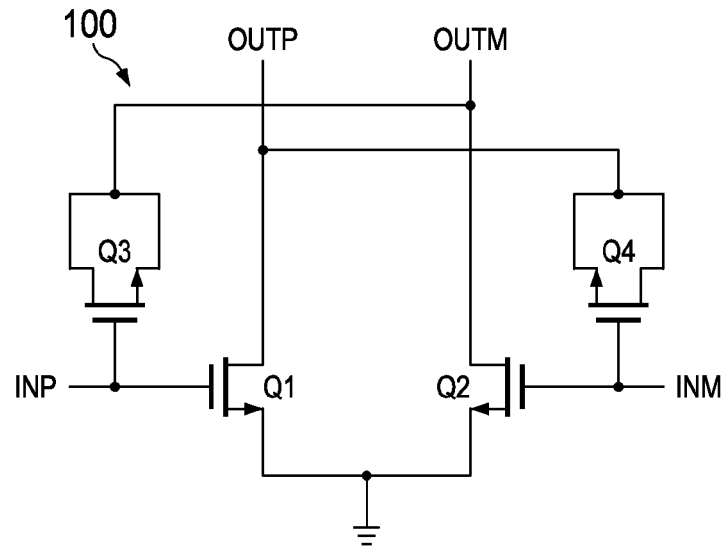
FIG. 1 is an example of a conventional Miller-compensated transconductance circuit.

Refer now to the drawings wherein depicted elements are, for the sake of clarity, not necessarily shown to scale and wherein like or similar elements are designated by the same reference numeral through the several views.

Figure 2:
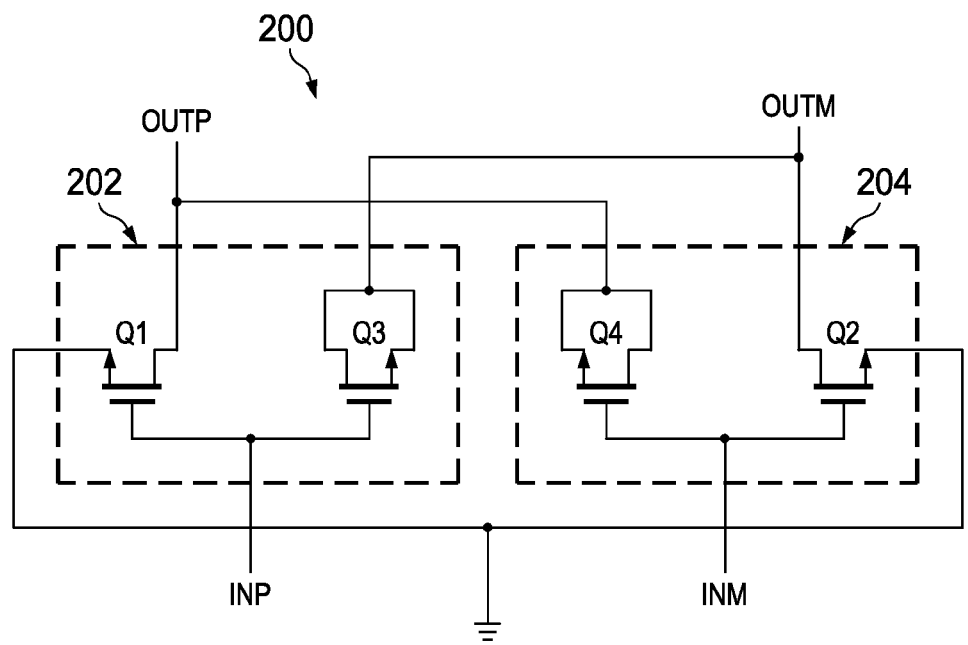
FIG. 2 is an example of a conventional Miller-compensated transconductance circuit in accordance with a preferred embodiment of the present invention.
Figure 3A:
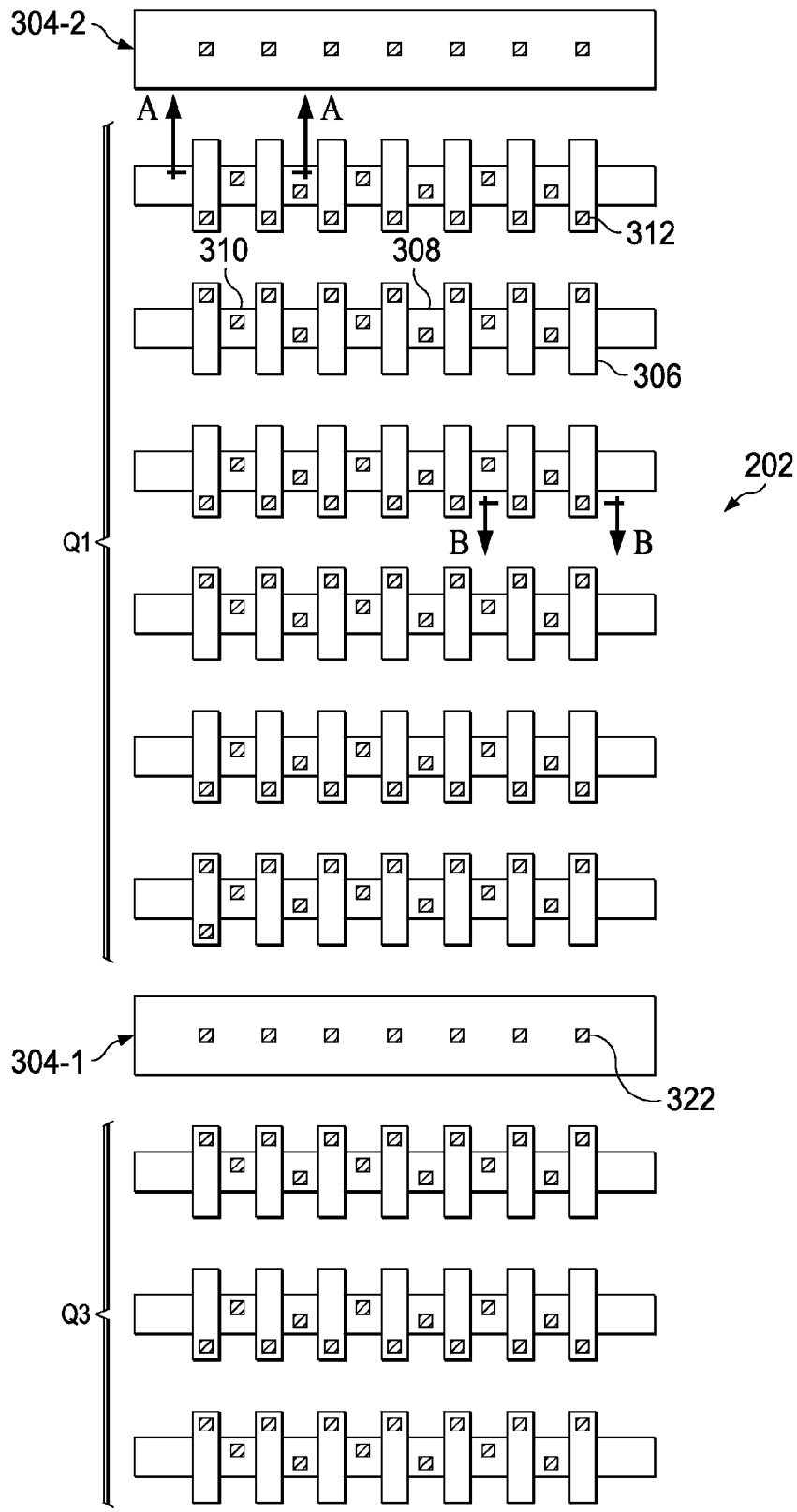
FIGS. 3A and 3B are plan views of a substrate having the transistors of the circuit of FIG. 2 formed thereon.
Figure 3B:
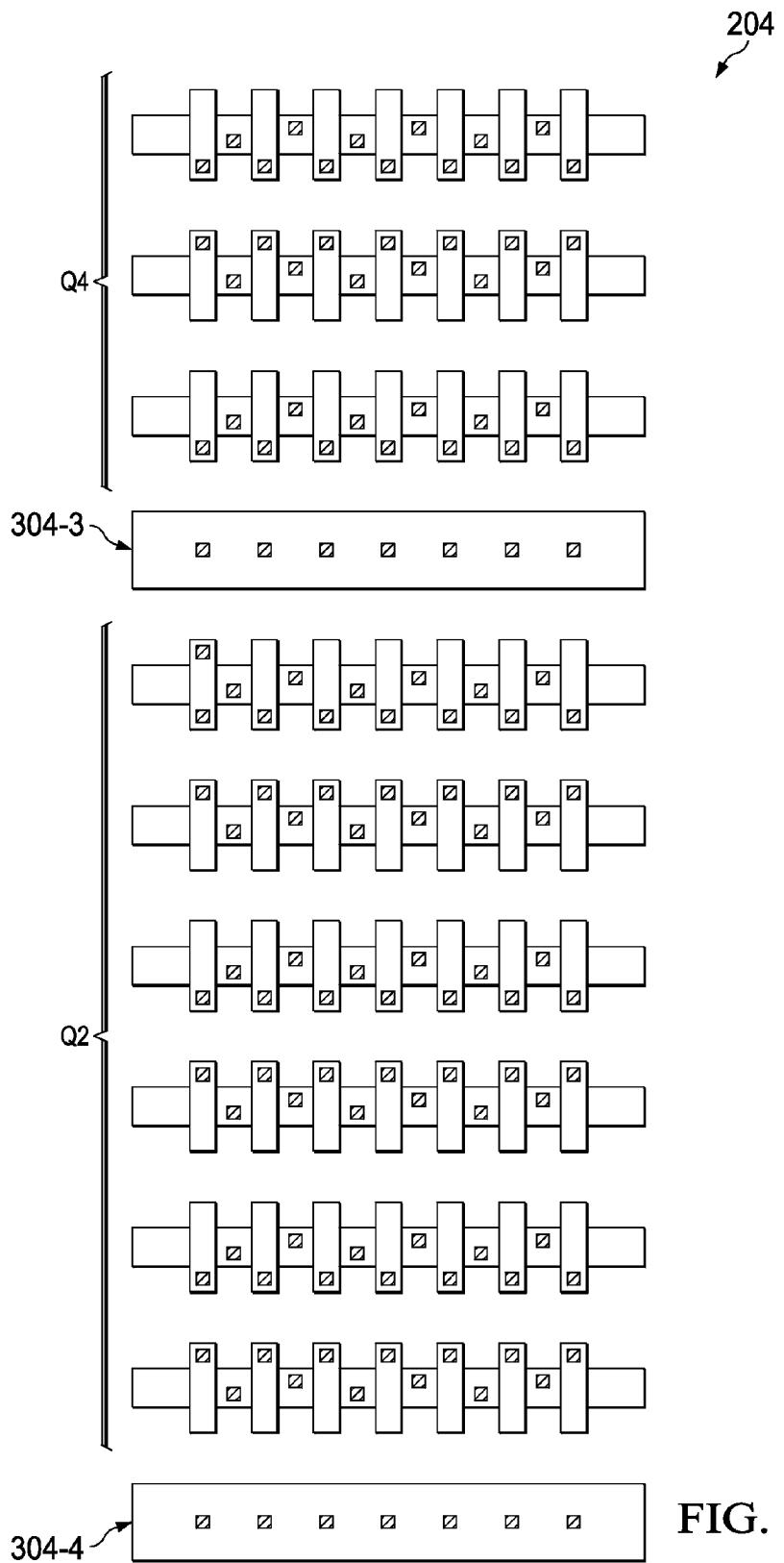
Figure 4:
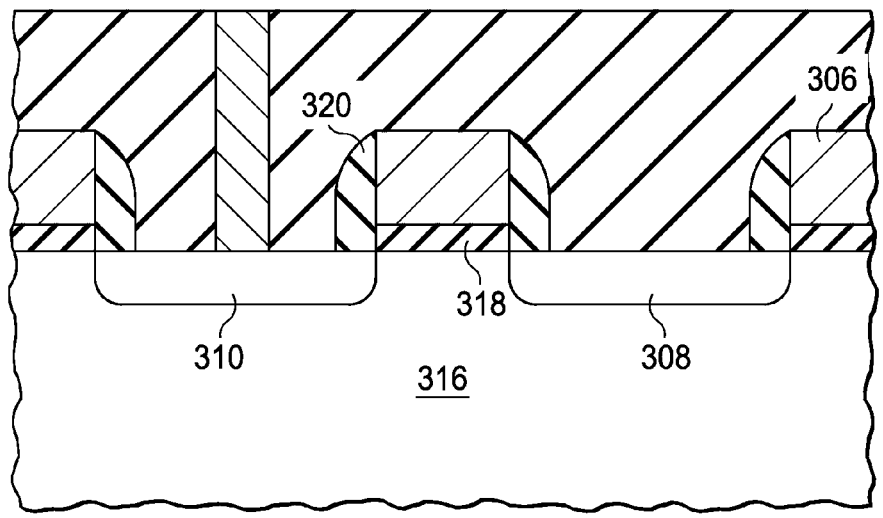
FIG. 4 is a cross-sectional view of a FIG. 3A along section line A-A.
Figure 5:
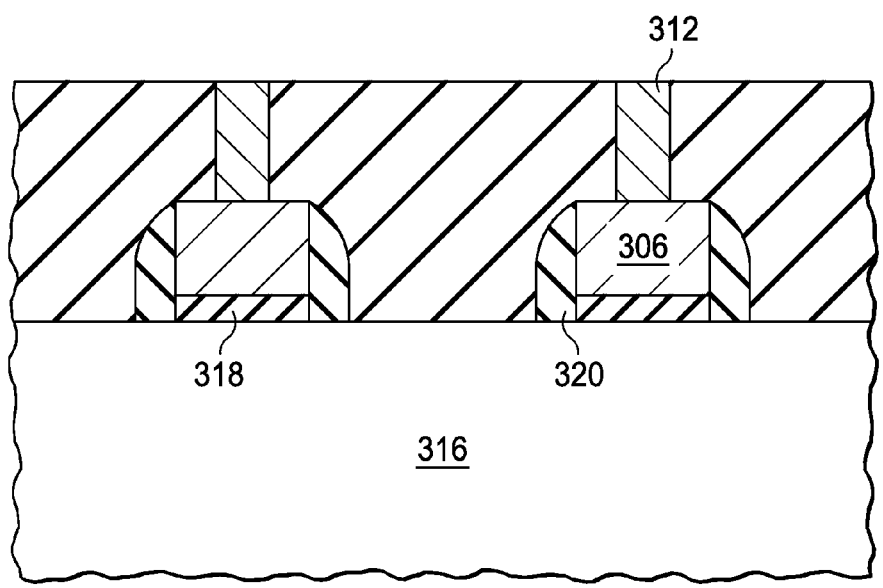
FIG. 5 is a cross-sectional view of FIG. 3B along section line B-B.

Turning to FIG. 2, an example of a transconductance circuit 200 in accordance with a preferred embodiment of the present invention can be seen. As shown in this example, transconductance circuit 200 generally comprises two integrated or merged MOS devices 202 and 204 that receive signals INP and INM. Device 202 generally comprises transistors Q1 and Q3 (which can, for example and as shown, be NMOS transistors), where transistor Q3 is, for example, a MOS capacitor. Device 204 generally comprises transistors Q2 and Q4 (which can, for example and as shown, be NMOS transistors), where transistor Q4 is, for example, a MOS capacitor. By using a MOS capacitor (i.e., transistor Q3 or Q4) that is merged together or integrated with another, complementary transistor (i.e., transistor Q1 or Q2), the MOS capacitor (i.e., transistor Q3 or Q4) can be made to match and be a ratio (in size) of its complementary transistor (i.e., Q1 or Q2). In an alternative arrangement, transistor Q1 and Q4 can be merged into device 202, while transistors Q2 and Q3 can be merged into device 204. Alternatively, the sources of transistors Q3 and Q4 may be coupled to ground, which would improve the linearity of the transconductance circuit 200.

In FIGS. 3A to 5, and example of the layout for transistors Q1 through Q4 of FIG. 2 can be seen in greater detail. As shown, each transistor Q1 through Q4 is generally comprised of a several transistor regions or segments, where each segment includes a number of source regions 308 and drain regions 310 arranged in an alternating pattern with gate formed therebetween, where the gates can be referred to as "fingers." Each gate is generally comprised of a gate dielectric 318 (which can be formed of silicon dioxide) formed over substrate 316, a gate electrode 306 (which can be formed of polysilicon) formed over the gate dielectric 308, and sidewalls 320. For example, each of transistors Q1 and Q2 can be comprised of 6 segments having alternating drain and source regions 310 and 308 with each segment having 16 "fingers," where each finger is 0.9 µm wide. Additionally and for example, transistors Q3 and Q4 can be about one-half the size of transistors Q1 and Q2, being comprised of 3 segments having alternating drain and source regions 310 and 308 with each segment having 16 "fingers," where each finger is 0.9 µm wide. With each device 202 and 204, there are also several back-gate regions. For device 202, transistor Q1 can be adjacent to or be in proximity to a back-gate region 304-2 of substrate 316, and back-gate region 304-1 can be located between transistors Q1 and Q3. For device 204, transistor Q2 can be adjacent to or be in proximity to a back-gate region 304-4 of substrate 316, and back-gate region 304-3 can be located between transistors Q2 and Q4.

Figure 6A:
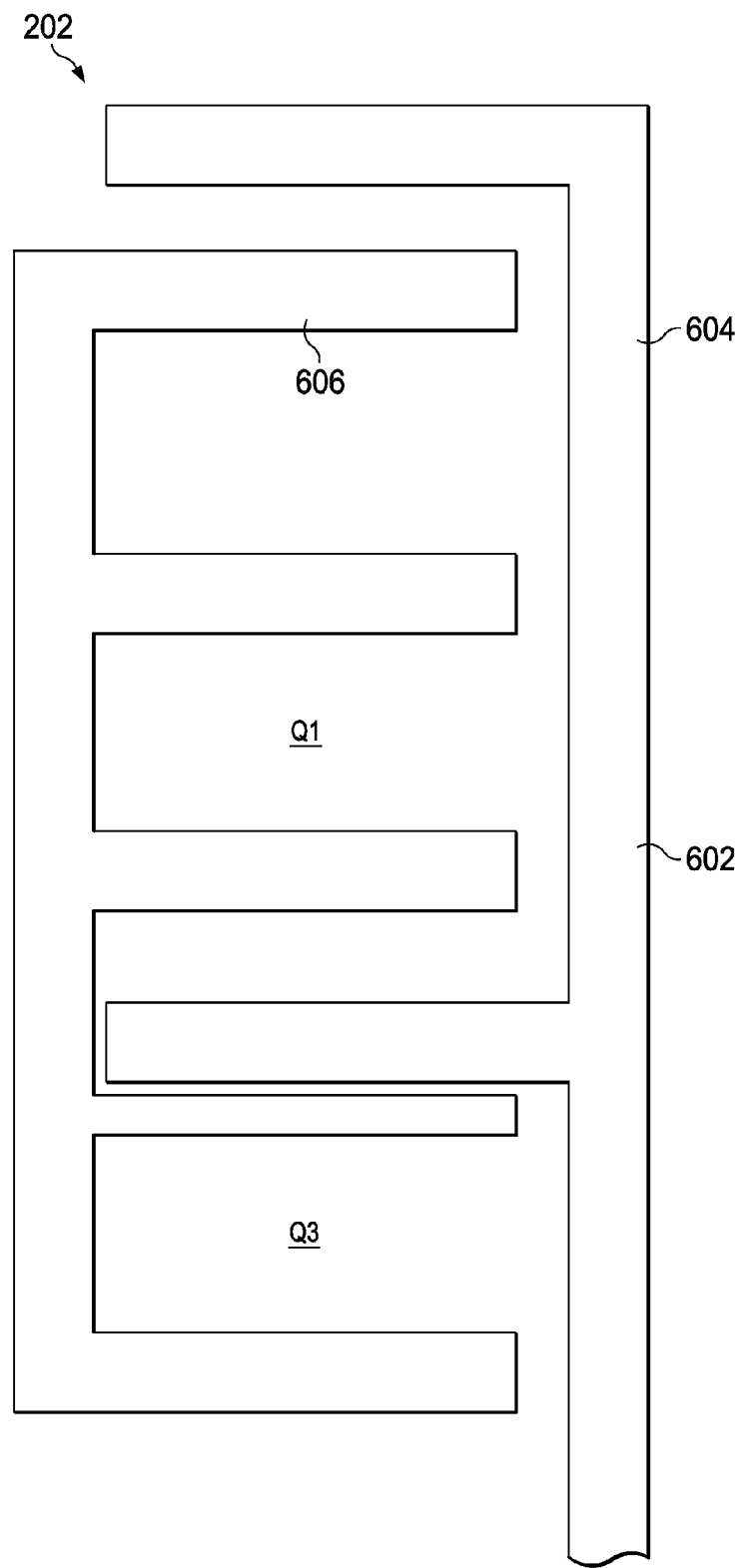
FIGS. 6A through 9B are plan views of metallization layers for the circuit of FIG. 2.
Figure 6B:
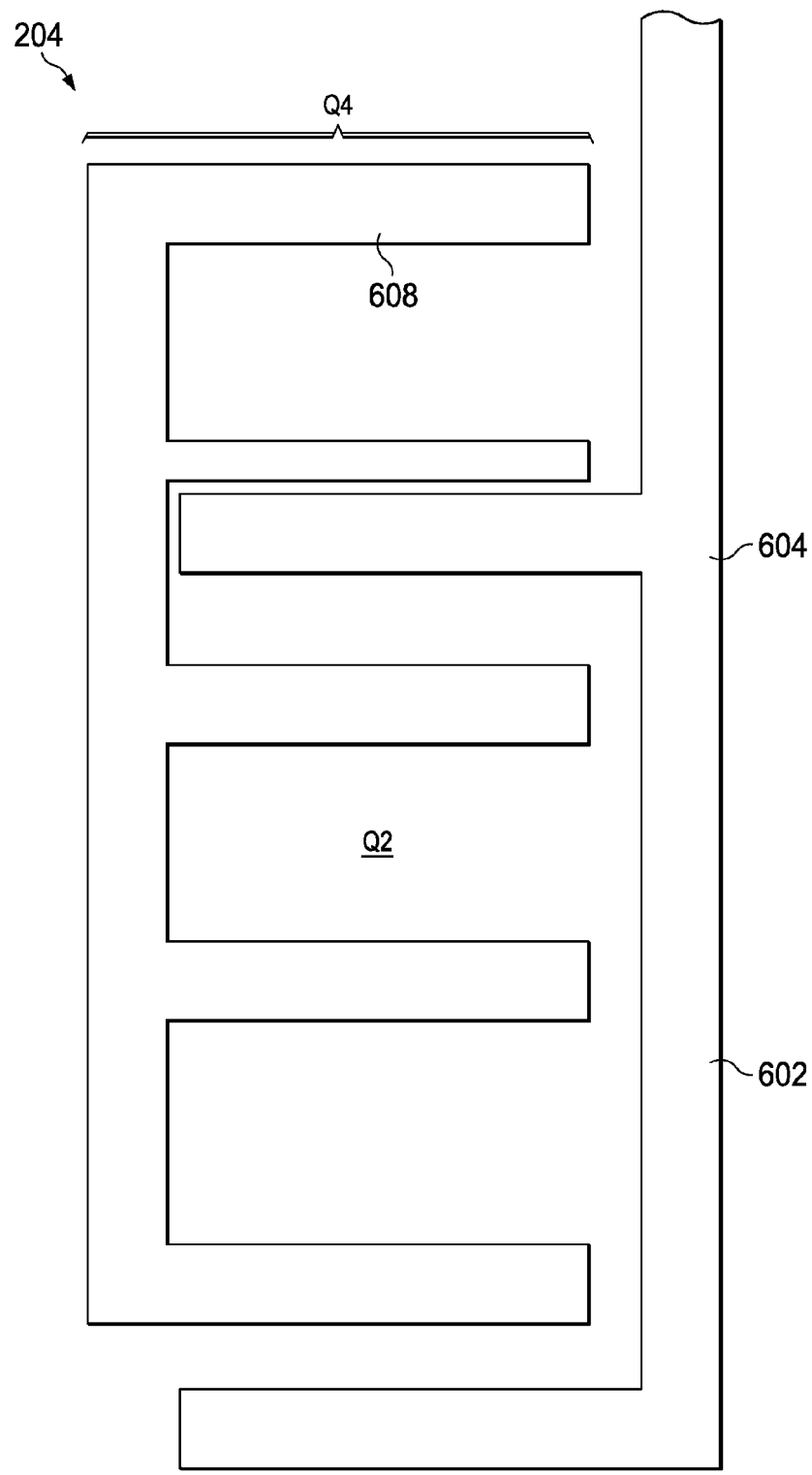

Turning now to FIGS. 6A and 6B, metallization layer 602 can be seen. Generally, metallization layer 602 is formed over the substrate 316 and over portions of transistors Q1 through Q4. As shown, metallization layer 602 (which can, for example, be formed of aluminum) generally comprises portions 604, 606, and 608. Portion 606 is generally coupled to vias 312 so as to couple the gate electrodes 306 of transistors Q1 and Q3 together, while portion 608 couples the gates of transistors Q2 and Q4 together. Thus, the gates of transistors Q1 and Q3 can signal INP through portion 606, and the gates of transistors Q2 and Q4 can receive signal INM through portion 608. Additionally, portion 604 is generally coupled to vias 322 so as to couple the back-gates 304-1 to 304-4 together, which is generally coupled to ground.

Figure 7A:
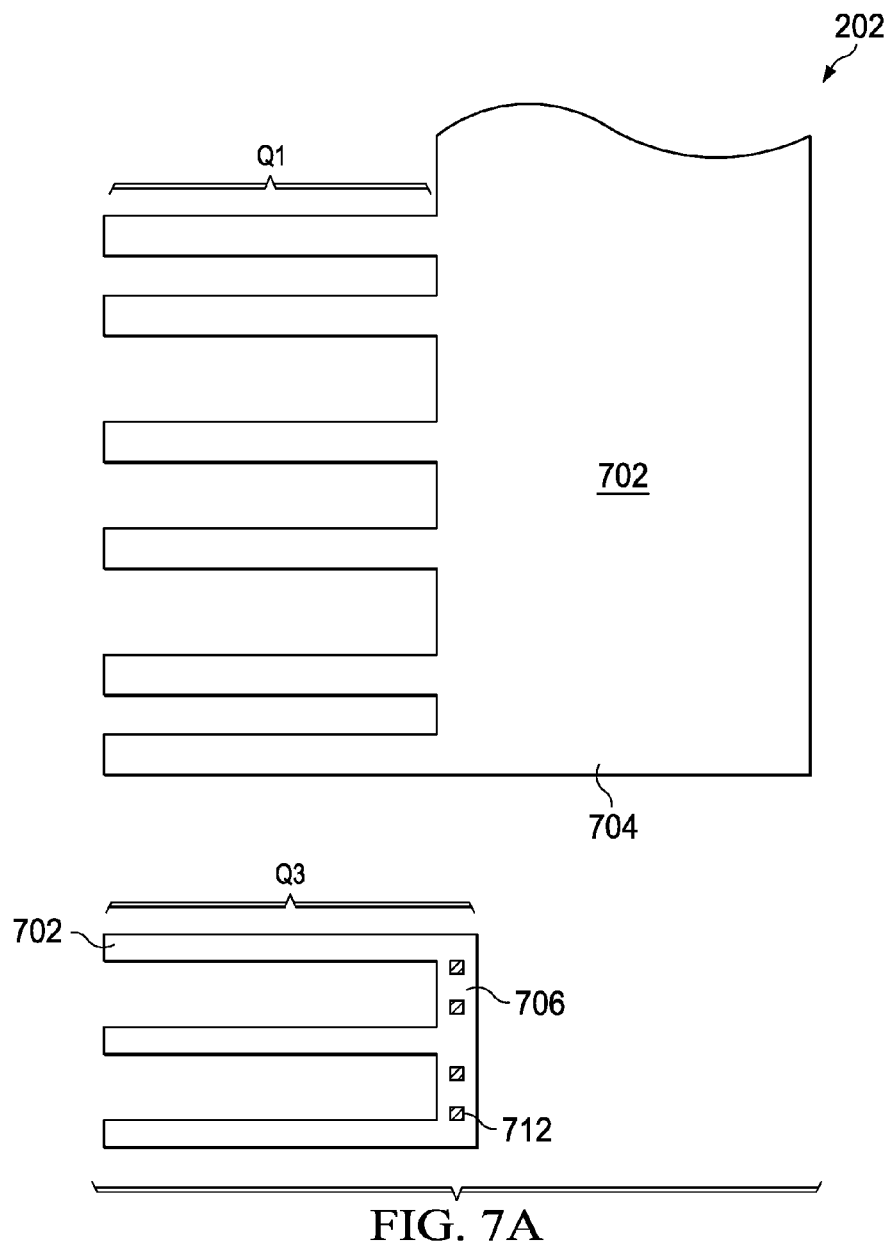
Figure 7B:
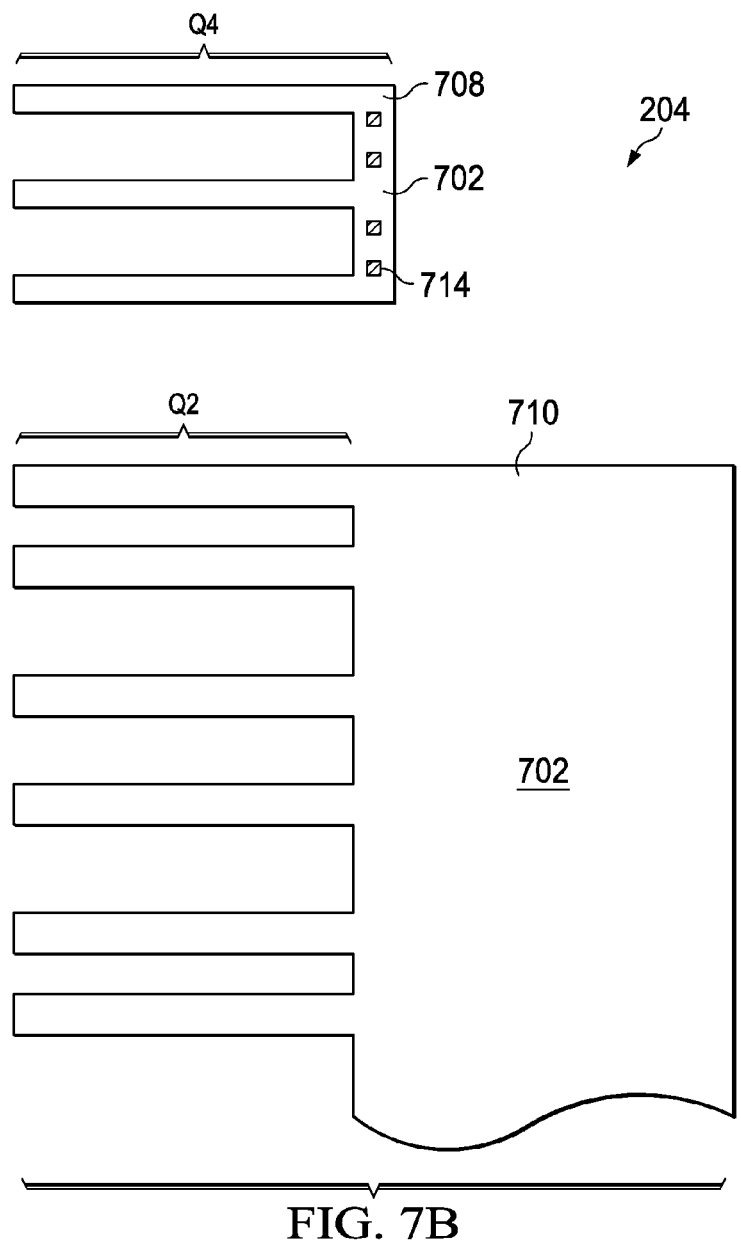

In FIGS. 7A and 7B, metallization layer 702 can be seen. Similar to metallization layer 602, metallization layer 702 can be formed of aluminum and can be formed over portions of transistors Q1 to Q4. Metallization layer 702 is generally comprised of portions 704, 706, 708, and 710. Portion 704 and 710 are generally each formed over a portion of transistors Q1 and Q2, respectively, so as to couple the sources of transistors Q1 and Q2 to a common node (i.e., ground) through vias 314. Portion 706 and 708 are generally formed over portions of transistor Q3 and Q4, respectively, and are coupled to the sources of transistors Q3 and Q4, respectively.

Figure 8A:
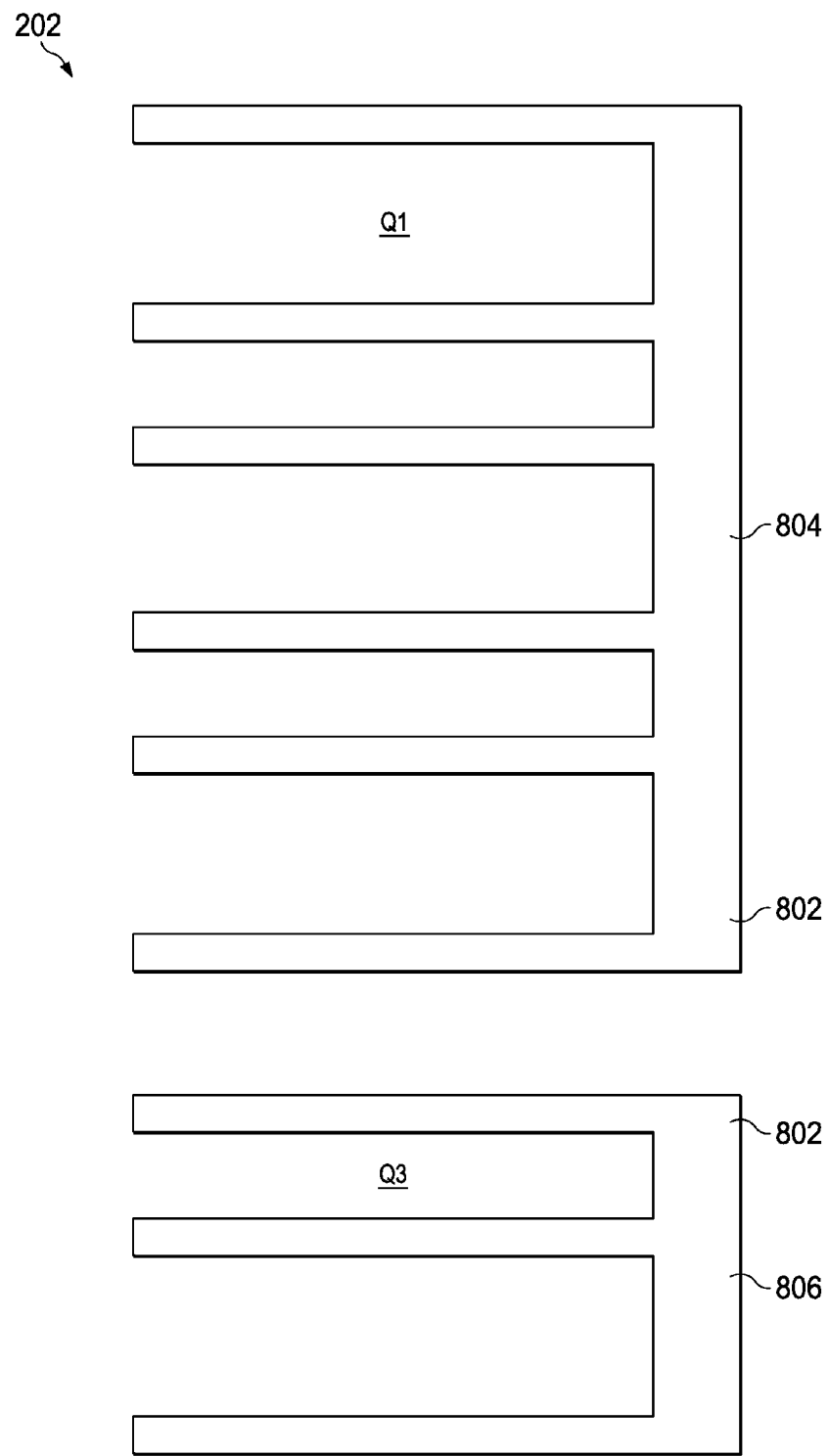
Figure 8B:
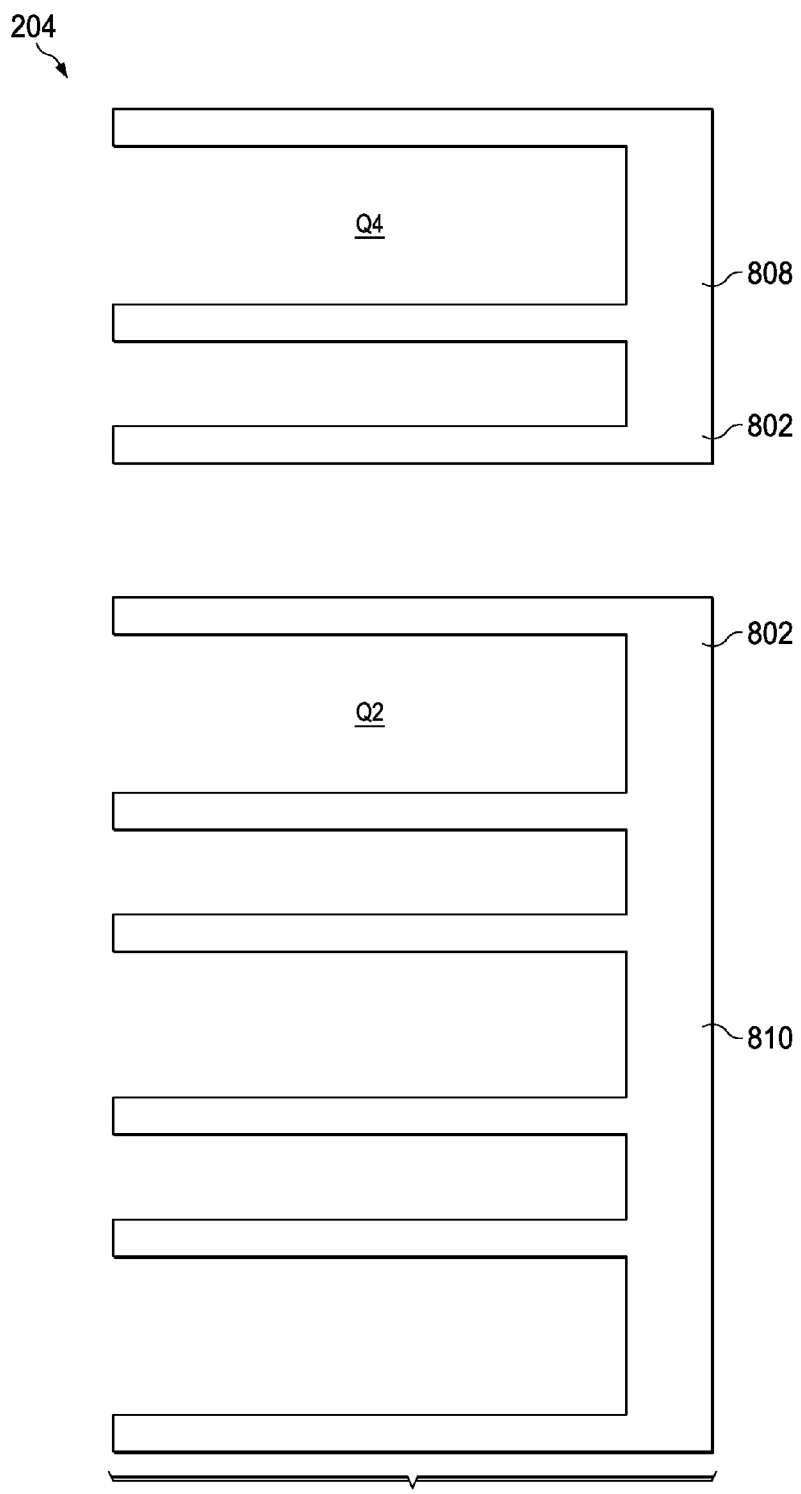

Turning to FIGS. 8A and 8B, metallization layer 802 can be seen. Metallization layer 802, too, can be formed of aluminum and is generally formed over portions of transistors Q1 through Q4. Namely, metallization layer 802 is generally comprised of portions 804, 806, 808, and 810. Portion 804 and 810 are generally formed over portions of transistors Q1 and Q2, respectively, and are coupled to the drains of transistors Q1 and Q2 through vias 314. Portion 806 and 808 are generally formed over portions of transistor Q3 and Q4, respectively, and are coupled to the drains of transistors Q3 and Q4, respectively. Additionally, vias 712 and 714 are generally coupled between portions 706/806 and 708/808, respectively, so that the drain and source of each of the transistors Q3 and Q4 are coupled together to form MOS capacitors.

Figure 9A:
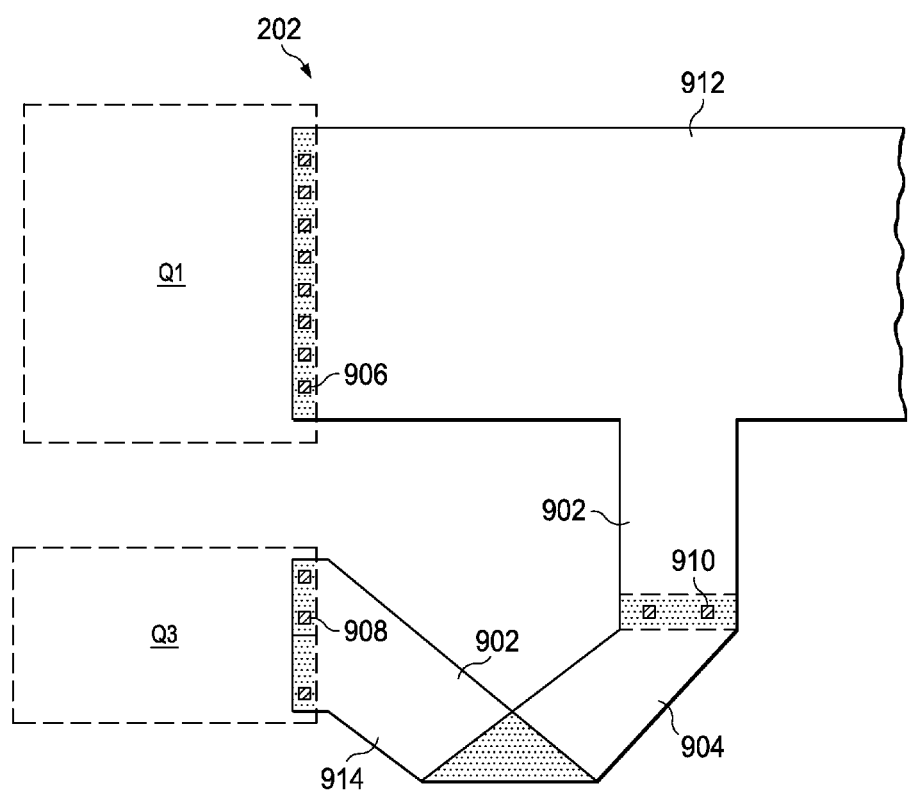
Figure 9B:
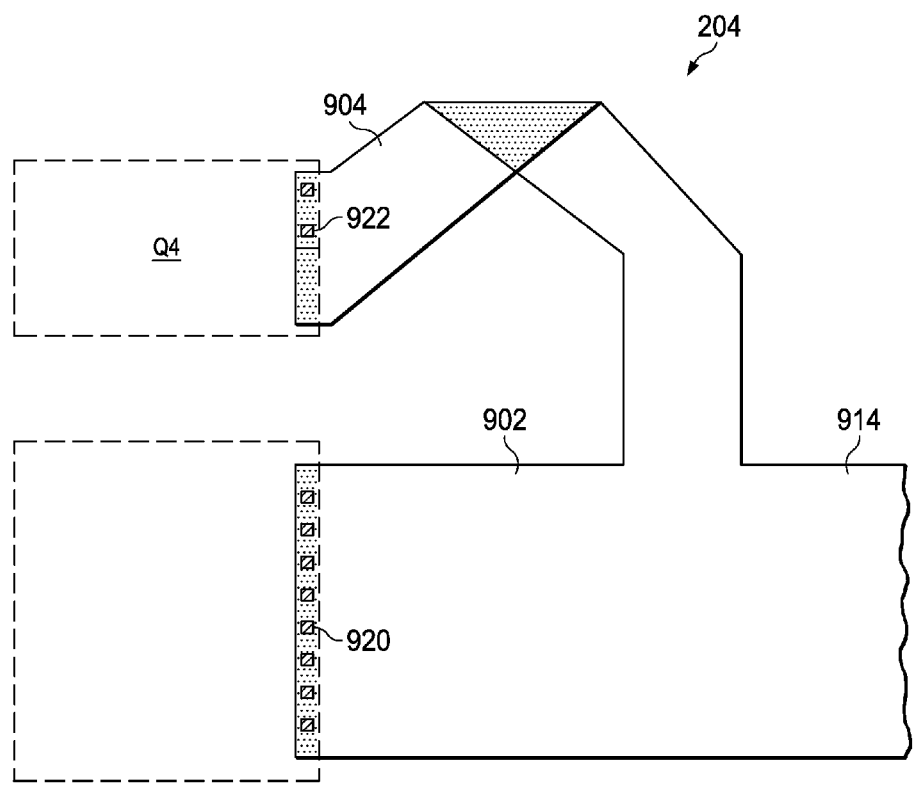

Finally, turning to FIGS. 9A and 9B, metallization layers 902 and 904 can be seen. As shown, portion 912 of metallization layer 902 is generally coupled to portion 804 through vias 906. Metallization layer 904 (which can be formed of aluminum) is then generally coupled to portion 912 through vias 910 and portion 810 through vias 922 so as to coupled the source of transistor Q1 to the drain and source of transistor Q4. Portion 914 of metallization layer 902 (which can be formed of aluminum) can then be coupled to portion 808 through vias 908 and portion 810 through vias 920 so as to couple the source of transistor Q2 to the source and drain of transistor Q3. Because of the use of metallization layer 904 as a "jumper," a slight parasitic inductance is introduced, but this inductance can be absorbed into the load with negligible impact.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a first back-gate region;
    a first MOS transistor that is adjacent to the first back-gate region;
    a second MOS transistor, wherein the gate of the first MOS transistor is coupled to the gate of the second MOS transistor;
    a second back-gate region located between the first and second MOS transistors;
    an isolation region that is adjacent to the second MOS transistor;
    a third back-gate region;
    a third MOS transistor that is adjacent to the third back-gate region, wherein the drain of the third MOS transistor is coupled to the drain and source of the second MOS transistor;
    a fourth MOS transistor that is adjacent to the isolation region, wherein the gate of the fourth MOS transistor is coupled to the gate of the third transistor, and wherein the drain and source of the fourth MOS transistor are the drain of the first MOS transistor; and
    a fourth back-gate region formed between the third and fourth transistors, and wherein the first, second, third, and fourth back-gate regions are coupled together.

2. The apparatus of claim 1, wherein each of the first, second, third, and fourth MOS transistors further comprises:
    a plurality of source regions formed in a substrate;
    a plurality of drain regions formed in the substrate, wherein the source and drain regions are formed in an alternating pattern; and
    a plurality of gates formed over the substrate, wherein each gate is formed between at least one of the source regions and at least one of the drain regions, and wherein each gate includes a gate dielectric and a gate electrode.

3. The apparatus of claim 1, wherein the apparatus further comprises a metallization layer formed over the substrate, and wherein the metallization layer that couples the gates of the first and second transistors together, that coupled the gates of the third and fourth MOS transistors together, and that coupled the first, second, third, and fourth back-gate regions together.

4. The apparatus of claim 3, wherein the metallization layer further comprises a first metallization layer, and wherein apparatus further comprises a second metallization layer that is formed over the substrate and that is coupled to the sources of the first, second, third, and fourth MOS transistors.

5. The apparatus of claim 4, wherein the apparatus further comprises a third metallization layer that is formed over the substrate and that is coupled to the drains of the first, second, third, and fourth MOS transistor.

6. The apparatus of claim 5, wherein the apparatus further comprises a fourth metallization layer that is formed over the substrate and that is coupled to the drain of the first MOS transistor, the drain and source of the second MOS transistor, the drain of the third MOS transistor, and the drain and source of the fourth MOS transistor.

7. The apparatus of claim 6, wherein the apparatus further comprises a fifth metallization that is coupled to the fourth metallization layer so as to electrically couple the drain of the first MOS transistor to the drain and source of the fourth MOS transistor.

8. An apparatus comprising:
    a substrate having first, second, third, and fourth back-gate regions;
    a first MOS transistor that is adjacent to the first and second back-gate regions, wherein the first MOS transistor includes:
        a first set of drain regions formed in the substrate;
        a first set of conductive vias, wherein each conductive via from the first set of conductive vias is coupled to at least one of the drain regions from the first set of drain regions;
        a first set of source regions formed in the substrate;
        a second set of conductive vias, wherein each conductive via from the second set of conductive vias is coupled to at least one of the source regions from the first set of source regions;
        a first set of gates formed over the substrate, wherein each gate from the first set of gates is formed between at least one of the source regions from the first set of source regions and at least one of the drain regions from the first set of drain regions; and
        a third set of conductive vias, wherein each conductive via from the third set of conductive vias is coupled to at least one of the gates from the first set of gates;
    a second MOS transistor that is adjacent to the second back-gate region, wherein the second MOS transistor includes:
        a second set of drain regions formed in the substrate;
        a fourth set of conductive vias, wherein each conductive via from the fourth set of conductive vias is coupled to at least one of the drain regions from the second set of drain regions;
        a second set of source regions formed in the substrate;
        a fifth set of conductive vias, wherein each conductive via from the fifth set of conductive vias is coupled to at least one of the source regions from the second set of source regions;
        a second set of gates formed over the substrate, wherein each gate from the second set of gates is formed between at least one of the source regions from the second set of source regions and at least one of the drain regions from the second set of drain regions; and
        a sixth set of conductive vias, wherein each conductive via from the sixth set of conductive vias is coupled to at least one of the gates from the second set of gates;
    an isolation region formed in the substrate that is adjacent to the second MOS transistor;
    a third MOS transistor that is adjacent to the third back-gate region and to the isolation region, wherein the third MOS transistor includes:
        a third set of drain regions formed in the substrate;
        a seventh set of conductive vias, wherein each conductive via from the seventh set of conductive vias is coupled to at least one of the drain regions from the third set of drain regions;
        a third set of source regions formed in the substrate;
        an eighth set of conductive vias, wherein each conductive via from the eighth set of conductive vias is coupled to at least one of the source regions from the third set of source regions;

a third set of gates formed over the substrate, wherein each gate from the third set of gates is formed between at least one of the source regions from the third set of source regions and at least one of the drain regions from the third set of drain regions; and a ninth set of conductive vias, wherein each conductive via from the ninth set of conductive vias is coupled to at least one of the gates from the third set of gates;

a fourth MOS transistor that is adjacent to the third and fourth back-gate regions, wherein the fourth MOS transistor includes:

a fourth set of drain regions formed in the substrate;

a tenth set of conductive vias, wherein each conductive via from the tenth set of conductive vias is coupled to at least one of the drain regions from the fourth set of drain regions;

a fourth set of source regions formed in the substrate;

an eleventh set of conductive vias, wherein each conductive via from the eleventh set of conductive vias is coupled to at least one of the source regions from the fourth set of source regions;

a fourth set of gates formed over the substrate, wherein each gate from the fourth set of gates is formed between at least one of the source regions from the fourth set of source regions and at least one of the drain regions from the fourth set of drain regions; and a twelfth set of conductive vias, wherein each conductive via from the twelfth set of conductive vias is coupled to at least one of the gates from the fourth set of gates;

a first metallization layer that is formed over the substrate, that couples the third and sixth sets of conductive vias together, that couples the ninth and twelfth sets of conductive vias together, and that is coupled to the first, second, third, and fourth back-gate regions;

a second metallization layer that is formed over the substrate and that is coupled to the second, fifth, eighth, and eleventh sets of conductive vias;

a thirteenth set of conductive vias formed over the second metallization layer;

a fourteenth set of conductive vias formed over the second metallizaion layer; and a third metallization layer that is formed over the substrate and that is coupled to the first, fourth, seventh, tenth, thirteenth, and fourteenth sets of conductive vias, wherein the third metallization layer couples the drain and source of the second MOS transistor together and couples the drain and source of the third MOS transistor together.

9. The apparatus of claim 8, wherein the apparatus further comprises:

a fifteenth set of conductive vias formed over the third metallization layer;

a sixteenth set of conductive vias formed over the third metallization layer;

a seventeenth set of conductive vias formed over the third metallization layer;

an eighteenth set of conductive vias formed over the third metallization layer; and a first portion of a fourth metallization layer that is coupled to the fifteenth set of conductive vias;

a second portion of the fourth metallization layer that is coupled to the sixteenth and eighteenth set of conductive vias;

a nineteenth set of conductive vias formed over the first portion of the fourth metallization layer; and a fifth metallization layer that is coupled to the seventeen and nineteenth sets of conductive vias.

10. The apparatus of claim 9, wherein the first metallization layer further comprises a first portion that is coupled to the first, second, third, and fourth back-gate regions;

a second portion that is coupled to the third and sixth set of conducive vias; and a third portion that is coupled to the ninth and twelfth sets of conductive vias.

11. The apparatus of claim 10, wherein the second metallization layer further comprises:

a first portion that is coupled to the second set of conductive vias;

a second portion that is coupled to the fifth set of conductive vias;

a third portion that is coupled to the eighth set of conductive vias; and a fourth portion that is coupled to the eleventh set of conductive vias.

12. The apparatus of claim 11, wherein the third metallization layer further comprises:

a first portion that is coupled to the first set of conductive vias;

a second portion that is coupled to the fourth set of conductive vias;

a third portion that is coupled to the seventh set of conductive vias; and a fourth portion that is coupled to the tenth set of conductive vias.

* * * * *